(12) United States Patent
Shin et al.

(10) Patent No.: US 7,558,473 B2
(45) Date of Patent: Jul. 7, 2009

(54) OPTICAL IMAGE STABILIZER FOR CAMERA LENS ASSEMBLY

(75) Inventors: Doo-Sik Shin, Suwon-si (KR);
Jeong-Kil Shin, Suwon-si (KR);
Hee-Seung Kim, Seoul (KR); Jong-Pil Lee, Cheongju-si (KR); Jin-Soo Seol, Cheongju-si (KR)

(73) Assignees: Samsung Electronics Co., Ltd., Suwon-Si, Gyeonggi-Do (KR); Ja Hwa Electronics Co., Ltd., Cheongwon-Gun, Chungcheongbuk-Do ( * ) Notice: Subject to any disclaimer, the term of this patent is extended or adjusted under 35 U.S.C. 154(b) by 609 days.

(21) Appl. No.: 11/407,495

(22) Filed: Apr. 20, 2006

(65) Prior Publication Data
US 2007/0025710 A1 Feb. 1, 2007

(30) Foreign Application Priority Data
Jul. 28, 2005 (KR) .................. 10-2005-0068967
Aug. 11, 2005 (KR) .................. 10-2005-0073792

(51) Int. Cl.
*G03B 17/00* (2006.01)
(52) U.S. Cl. ............... 396/55; 396/542; 348/208.7; 348/374
(58) Field of Classification Search ............ 396/52–55, 396/542; 348/208.7, 374
See application file for complete search history.

(56) References Cited

U.S. PATENT DOCUMENTS

| 6,011,294 | A | 1/2000 | Wetzel .................. 257/434 |
| 6,940,542 | B2 * | 9/2005 | Kitazawa et al. ....... 348/208.99 |
| 7,355,630 | B2 * | 4/2008 | Uenaka et al. ........... 348/208.2 |
| 2006/0018645 | A1 * | 1/2006 | Stavely .................. 396/55 |
| 2006/0269263 | A1 * | 11/2006 | Kim et al. ................ 396/55 |

FOREIGN PATENT DOCUMENTS

| JP | 2002-296633 | 10/2002 |
| JP | 2003-110929 | 4/2003 |
| JP | 2005-102172 | 4/2005 |

* cited by examiner

*Primary Examiner*—William B. Perkey
(74) *Attorney, Agent, or Firm*—Cha & Reiter, LLC

(57) ABSTRACT

An optical image stabilizer for use in a camera lens assembly includes: a main frame including a main circuit board; a driving frame installed so as to move on the main frame in at least one direction; a camera device including a sub-circuit board, the camera device being mounted on the driving frame; and a circuit connection for electrically connecting the main circuit board to the sub-circuit board, wherein the circuit connection includes both of its ends coupled to the main circuit board and the sub-circuit board, respectively, and a plurality of lead wires constructed so as to be moved separately with respect to the main circuit board and the sub-circuit board.

20 Claims, 12 Drawing Sheets

OPTICAL IMAGE STABILIZER FOR CAMERA LENS ASSEMBLY

CLAIM OF PRIORITY

This application claims priority to an application entitled "Optical Image Stabilizer For Camera Lens Assembly," filed in the Korean Intellectual Property Office on Jul. 28, 2005 and assigned Serial No. 2005-68967 and on Aug. 11, 2005 and assigned Serial No. 2005-73792, the contents of which are hereby incorporated by reference.

BACKGROUND OF THE INVENTION

1. Field of the Invention

The present invention relates to a camera lens assembly, and more particularly to an optical image stabilizer for correcting distorted images arising from hand trembling during photographing of an object.

2. Description of the Related Art

With the recent development of a technology for miniaturizing and downsizing a digital camera, it has been possible to integrate a camera function to a mobile communication terminal. Therefore, the usage of a mobile communication terminal equipped with an optical lens and a camera device has been widely spread.

Due to mobility, images are distorted due to vibration or hand trembling arising from the human body. Thus, as photographing during movement increases, it is necessary to correct vibration such as hand trembling in order to obtain clear images.

The current image stabilization technology may be classified into an Electronic Image Stabilization (EIS), e.g. Digital Image Stabilization (DIS) and an Optical Image Stabilization (OIS). According to electronic image stabilization method, hand trembling is detected from the photographed images, then stored image data in a camera device or a memory are corrected. In other words, a camera device receives distorted images intact and adjusts positions, colors, etc., of the distorted images by electronic methods or programs, thereby minimizing images distortion.

Such an electronic image stabilization is advantageous in that it does not need a separate mechanic and physical construction, and has a low price and low structural restriction. Further, it can be easily employed. However, since the electronic image stabilization corrects distorted images using a software, it needs a separate memory or a camera device with high performance. Also, since it takes much time to correct distorted images, photographing speed may become slow. Furthermore, since there is a limitation in removing afterimages using a software, the correction rate may deteriorate.

Meanwhile, in the OIS method, the hand trembling of a user is detected, and the position of an optical lens or a camera device is altered, so that it is possible to alter images of an object formed on the camera device to compensate for the trembling.

As an OIS needs a separate driving apparatus, manufacturing cost increases and an installation space must be provided. However, since the OIS can remove afterimages by settling images with no distortion on a camera device, it is possible to maintain a correction rate greater than 90%. Hence, the OIS can photograph a more clear image as compared with the electronic image stabilization. Accordingly, in a photographing apparatus requiring high resolution, the OIS is preferable to the electronic image stabilization.

A technology for correcting hand trembling, etc., by moving an optical lens may be used in a digital camera if there were enough space to include a driving unit for driving the optical lens. However, due to limited available space in a small digital camera or a mobile communication terminal, this solution is not desirable. Therefore, research into a technology for correcting hand trembling, etc., by merely moving a camera device has been actively conducted.

As illustrated in FIG. 1, a conventional camera device 10 has a construction in which an image sensor 21 mounted on a predetermined frame 11 transmits photographed image information while communicating with a main circuit board through a flexible printed circuit 41. The flexible printed circuit 41 has a construction in which a copper plated wire 44 pattern is formed on a flexible base 43 for maintaining the board shape, and a cover layer 45 is formed so as to prevent a disconnection of the copper plated wire 44 and insulate the copper plated wire 44.

However, in constructing an optical image stabilizer for a camera lens assembly, a flexible printed circuit connected to a camera device may lower the correction rate for hand trembling. That is, a camera device moves with both an oscillation frequency within several tens of Hz and fine amplitude by the optical image stabilizer. Therefore, the camera device needs a larger driving force due to the load of a flexible printed circuit. Further, since the load of the flexible printed circuit does not always operate constantly, it may deteriorate the correction rate. The deterioration of the correction rate becomes more severe when a camera device moves in a direction vertical to a longitudinal direction of a flexible printed circuit during an image correction. Further, increase in a driving force required for correction of hand trembling, etc., causes increase of power consumption, thereby shortening the lifespan of a rechargeable battery of a photographing apparatus such as a wireless terminal equipped with a digital camera or a camera lens assembly. Moreover, in the case of using a high performance of camera device with a high number of pixels, an increased number of plated wires are required and the width of a flexible printed circuit increases. Therefore, the load of such a flexible printed circuit may cause the correction rate to be further deteriorated.

SUMMARY OF THE INVENTION

Accordingly, the present invention has been made to solve the above-mentioned problems occurring in the prior art and provides additional advantages, by providing an optical image stabilizer for a camera lens assembly, which can improve the correction rate by reducing the load of circuit connections for communication between a camera device and a main circuit board.

One aspect of the present invention to provide an optical image stabilizer for a camera lens assembly, which can reduce power consumption by reducing the load of a circuit connection for communication between a camera device and a main circuit board and decreases the driving force required for an image correction.

Another aspect of the present invention is to provide an optical image stabilizer for a camera lens assembly, which includes: a main frame including a main circuit board; a driving frame installed so as to move on the main frame in at least one direction; a camera device including a sub-circuit board, the camera device being mounted on the driving frame; and a circuit connection for electrically connecting the main circuit board to the sub-circuit board, wherein the circuit connection includes both sides connected to the main circuit board and the sub-circuit board, respectively, and a plurality of lead wires constructed so as to be moved separately with respect to the main circuit board and the sub-circuit board.

BRIEF DESCRIPTION OF THE DRAWINGS

The above features and advantages of the present invention will be more apparent from the following detailed description taken in conjunction with the accompanying drawings, in which.

DETAILED DESCRIPTION

Figure 1:
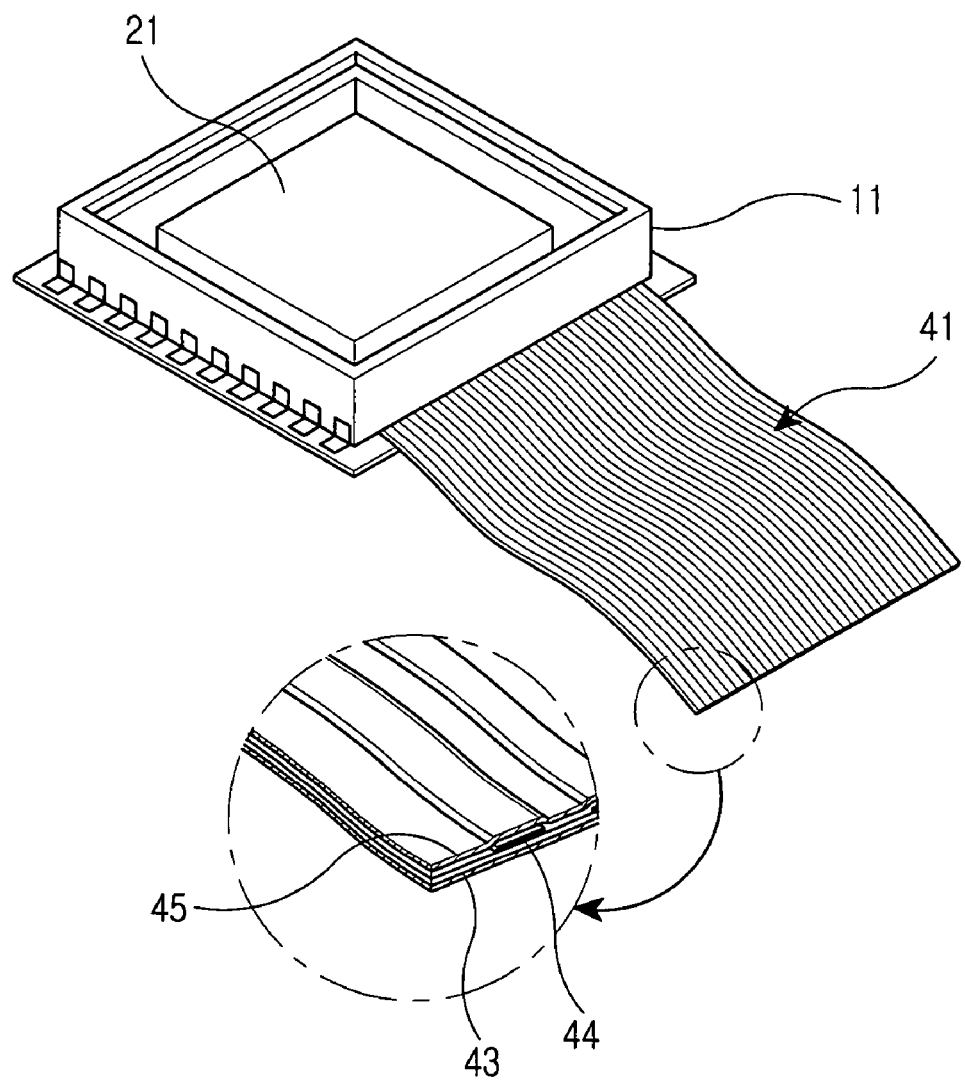
FIG. 1 is a perspective view illustrating a camera device of a camera lens assembly according to the prior art.

An embodiment of the present invention will be described in detail herein below with reference to the accompanying drawings. For the purposes of clarity and simplicity, a detailed description of known functions and configurations incorporated herein will be omitted as it may obscure the subject matter of the present invention.

As illustrated in FIGS. 2 to 6, an optical image stabilizer 100 for a camera lens assembly according to an embodiment of the present invention includes a main frame 101, a driving frame 102, coils 143, and permanent magnets 125. The driving frame 102 moves on the main frame 101 by an interaction between the coils 143 and the permanent magnets 125, and changes the position of a camera device 103, so that it is possible to correct the distortion of photographed images which results from the hand trembling of a user.

Figure 2:
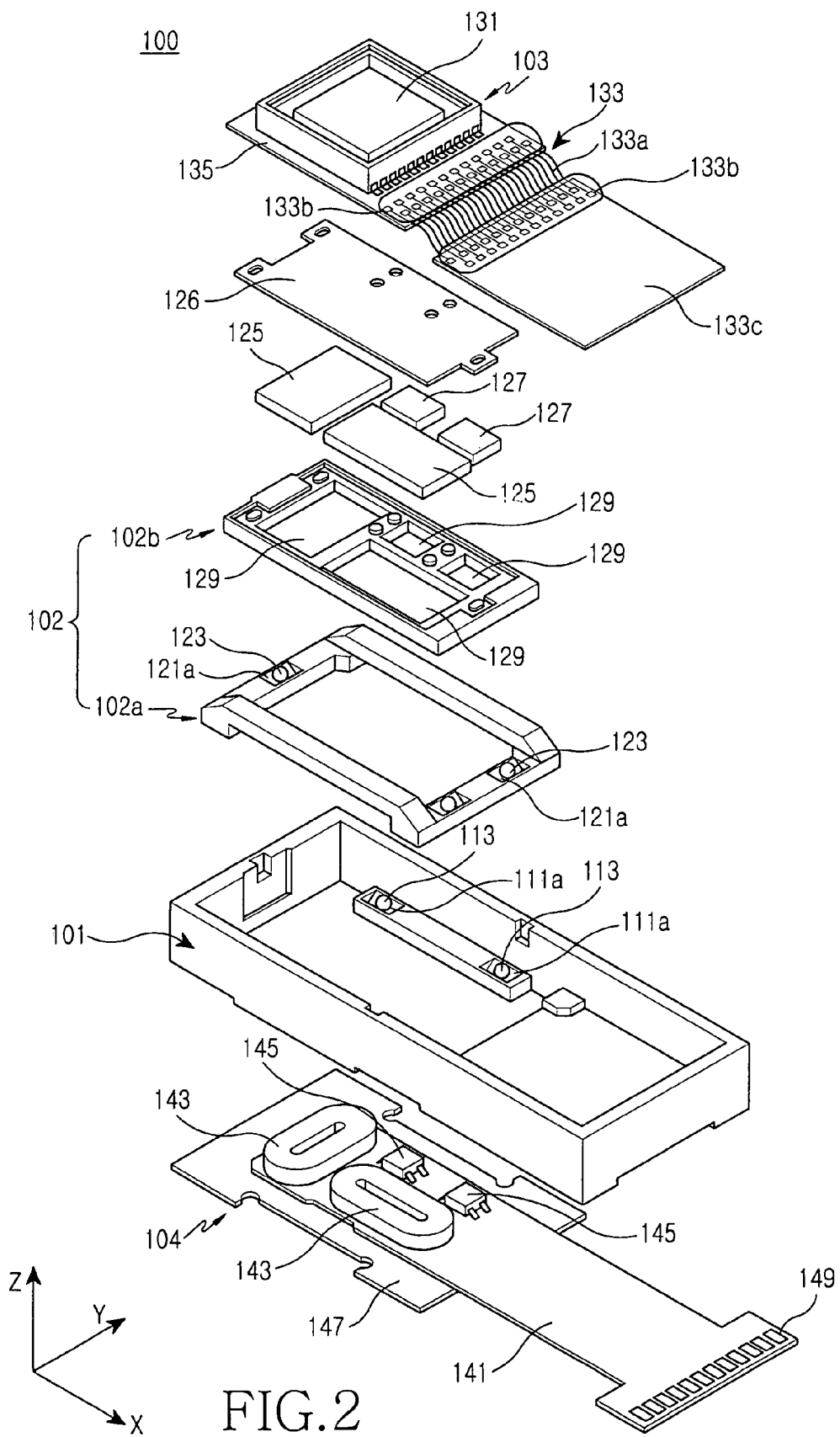
FIG. 2 is an exploded perspective view illustrating an optical image stabilizer for a camera lens assembly according to an embodiment of the present invention.
Figure 3:
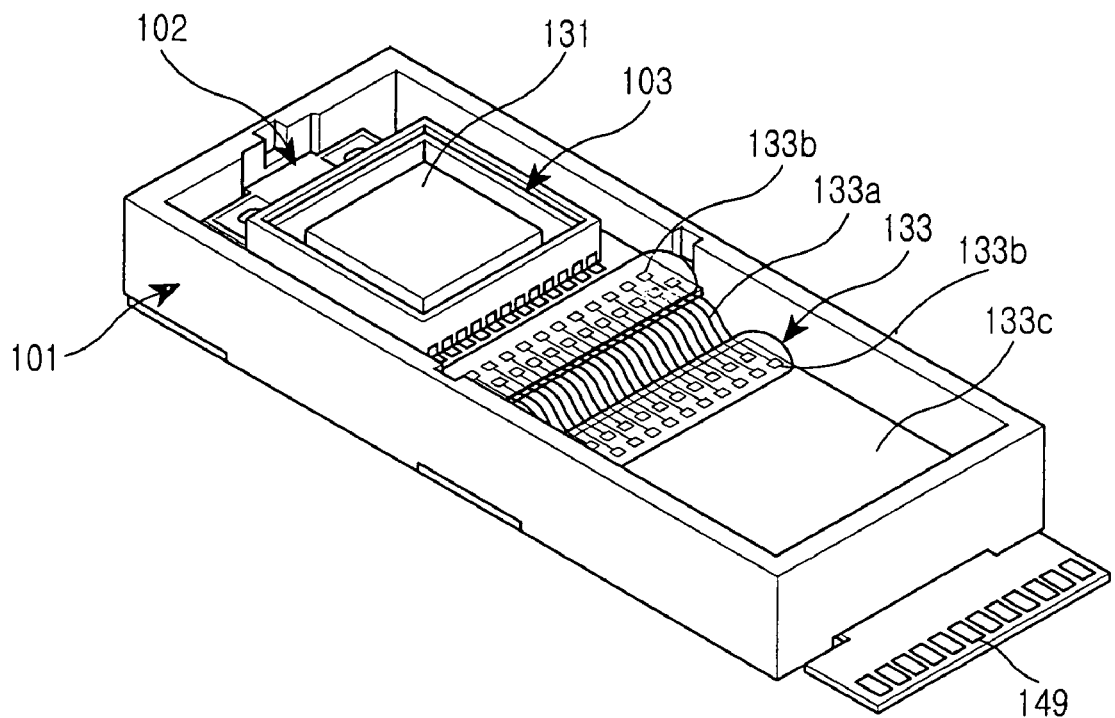
FIG. 3 is a perspective view illustrating the optical image stabilizer shown in FIG. 2.
Figure 4:
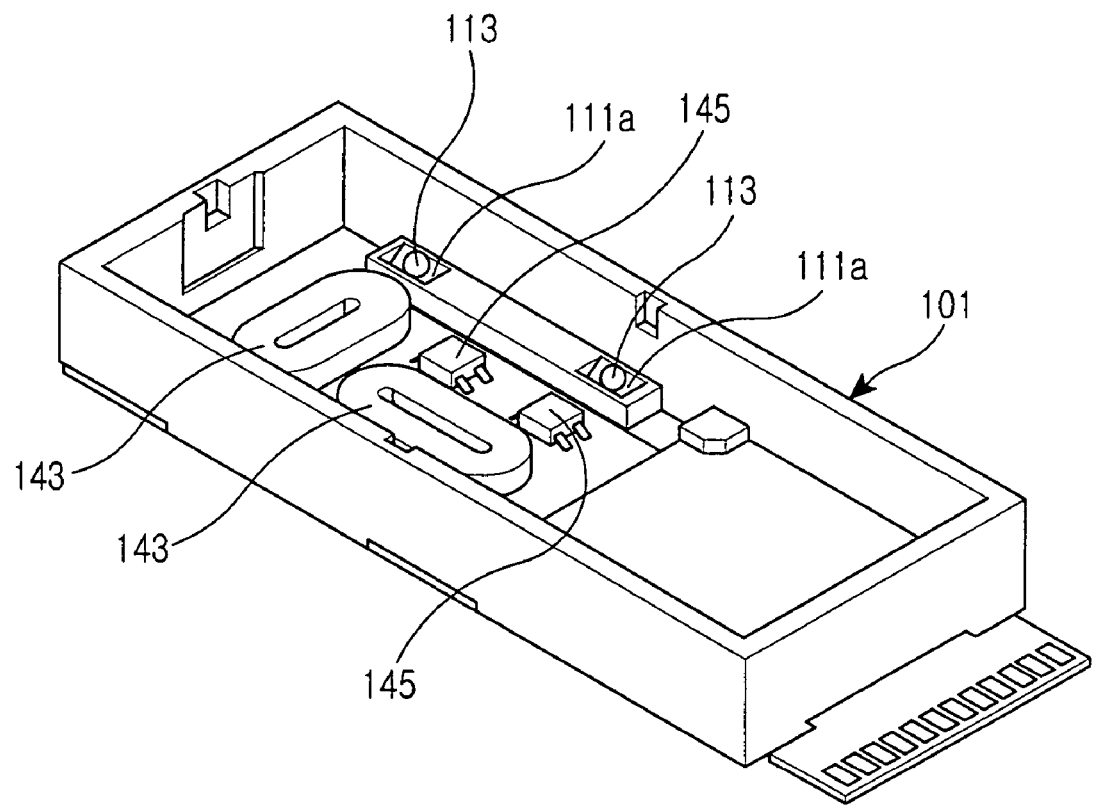
FIG. 4 is a perspective view illustrating a main frame of the optical image stabilizer shown in FIG. 2.

Referring to FIGS. 2 and 4, the main frame 101 has an upper surface and a lower surface. The upper surface is at least partially opened so that the image of an object is incident into the camera device 103. The lower surface is formed with the first sliding grooves 111a that is opened toward the incidence direction Z of the object image. The first sliding grooves 111a extend along a first direction X. In order to form the first sliding grooves 111a, ribs may be formed on an inner side of the lower end of the main frame 101.

The main frame 101 has a lower surface closed by a coil member 104. The coil member 104 includes a printed circuit board 141 having a connector 149 formed on one end of the printed circuit board 141, one pair of coils 143 mounted on the printed circuit board 141, and position detection sensors 145 for detecting both movement or non-movement of the driving frame 102, and a movement range of the driving frame 102. The coils 143 may generally use a winding coil wound by a winding machine and may use a laminated coil manufactured by a Micro Electro Mechanical System (MEMS) scheme. The printed circuit board 141 includes a lower surface on which a yoke 147 is mounted.

The driving frame 102 includes a first frame 102a and a second frame 102b which are laminated along the incidence direction of the object image and surrounded by the main frame 101.

Figure 5A:
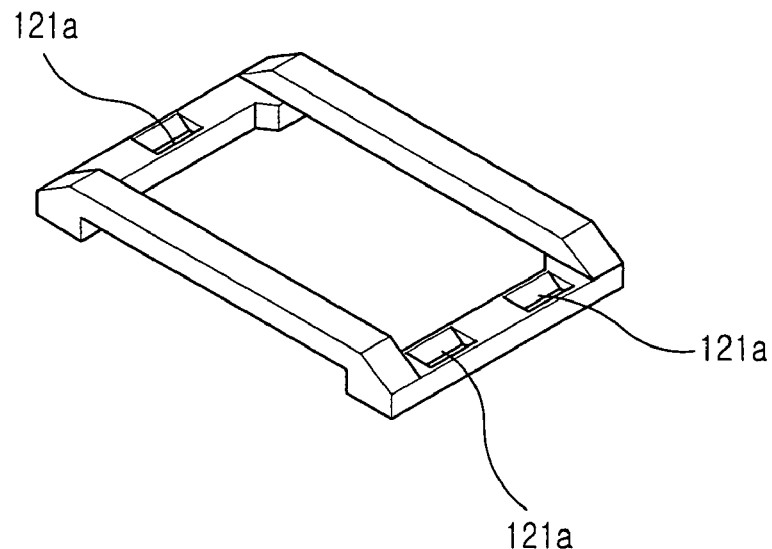
FIG. 5 is a perspective view illustrating a first frame of the optical image stabilizer shown in FIG. 2.
Figure 5B:
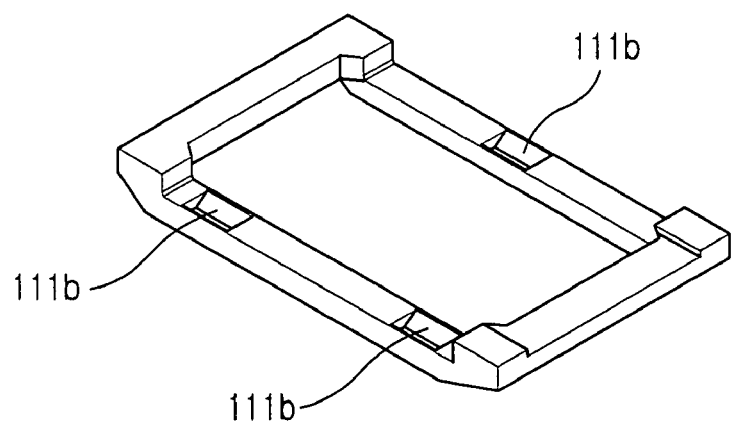

Referring to FIGS. 2 and 5, the first frame 102a includes second sliding grooves 111b extending along the first direction X on its lower surface, and the second sliding grooves 111b are located at opposite end of the first sliding grooves 111a. Balls 113 are interposed between the main frame 101 and the first frame 102a, i.e., the first sliding grooves 111a and the second sliding grooves 111b, respectively. Each of the balls 113 is partially accommodated in the first sliding grooves 111a and in the second sliding grooves 111b, respectively, so that the main frame 101 is spaced apart from the first frame 102a. Each of the first sliding grooves 111a and each of the second sliding grooves 111b extend along the first direction X, respectively, so that the first frame 102a can smoothly move along the first direction X with no friction in relation to the main frame 101. That is, the combination of the first sliding grooves 111a, the second sliding grooves 111b and the balls 113 functions as a ball bearing which enables the first frame 102a to smoothly move thereon. Herein, the first sliding grooves 111a and the second sliding grooves 111b may be constructed in various shapes. However, it is preferred that their sections have a "V" shape.

Both ends of the second frame 102b is surrounded by the first frame 102a and moves in a second direction Y on the first frame 102a. The second direction Y is set to be a vertical relation to the first direction X. The second frame 102b is installed on the first frame 102a, so that the second frame 102b can move in the first direction X with respect to the main frame 101 together with the first frame 102a. Further, the second frame 102b moves in the second direction Y on the first frame 102a, so that the second frame 102b can move in the first and the second directions X and Y with respect to the main frame 101.

Figure 6A:
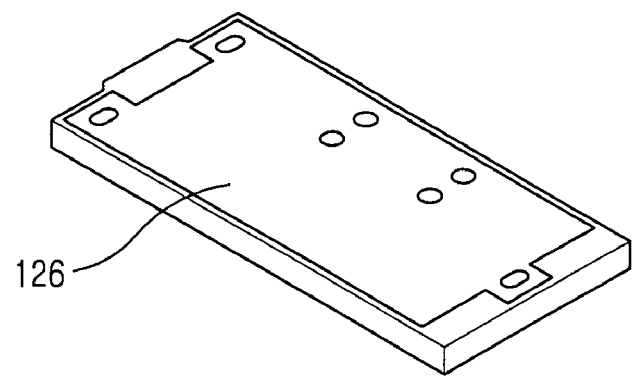
FIG. 6 is a perspective view illustrating a second frame of the optical image stabilizer shown in FIG. 2.
Figure 6B:
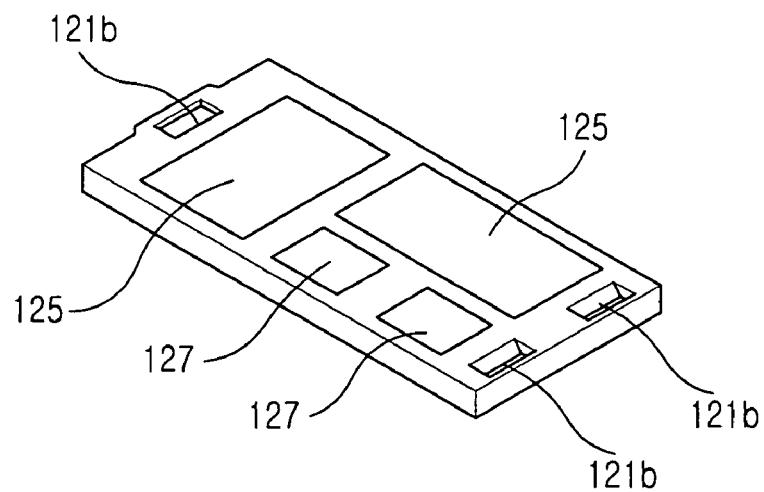
Figure 7:
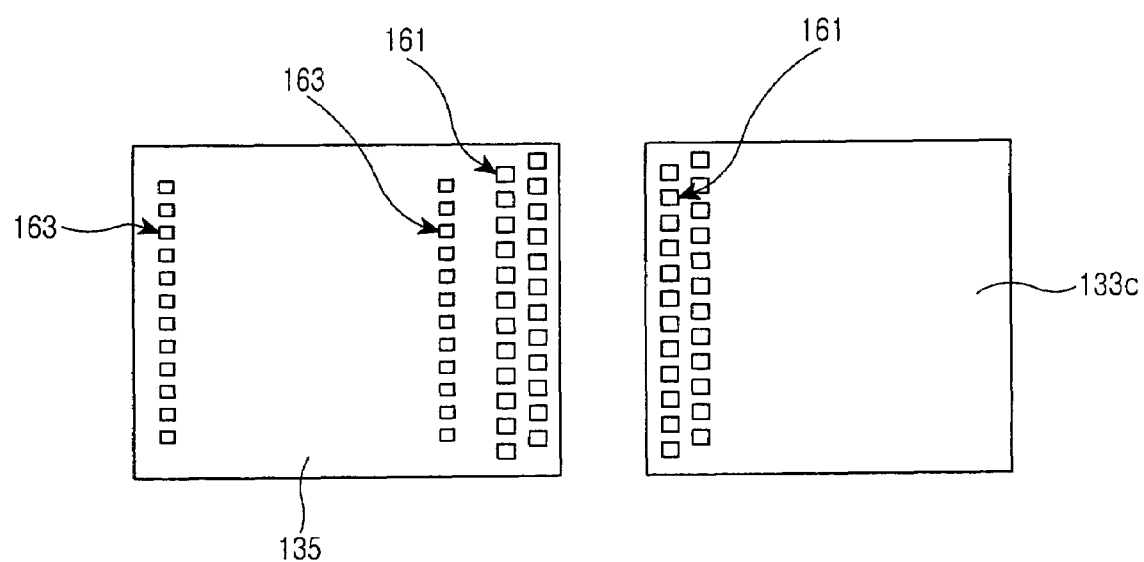
FIGS. 7 to 10 are diagrams sequentially illustrating a process for constructing a circuit connection of a main circuit board and a sub-circuit board in the camera lens assembly shown in FIG. 2.

Referring to FIGS. 2 and 6, the second frame 102b includes one pair of permanent magnets 125 for driving, which are respectively opposite to the coils 43, and permanent magnets 127 for sensing which are respectively opposite to the position detection sensors 145. Further, a yoke 126 for forming a magnetic path is attached to the upper surfaces of the permanent magnets 125 and the permanent magnets 127, so that the magnetic force of the permanent magnets 125 and 127 can be effectively utilized.

The magnetic force of the permanent magnets 125 and 127 generate a driving force, which enables the second frame 102b to move in the first and the second directions X and Y, by an interaction with an electromagnetic force generated by the coils 143. The position detection sensors 145 detect the change in positions of the permanent magnets 127, thereby monitoring the movement position of the second frame 102b.

The first frame 102a includes one or more third sliding grooves 121a extending along the second direction Y on its upper surface so that the second frame 102b can smoothly move in the second direction Y. Further, fourth sliding grooves 121b are formed on the lower surface of the second frame 102b, so that the fourth sliding grooves 121b are located oppositely to the third sliding grooves 121a.

Balls 123 are interposed between the first frame 102a and the second frame 102b, i.e., the third sliding grooves 121a and the fourth sliding grooves 121b, so that the second frame 102b can smoothly move in the second direction Y. Further, ball bearing types are determined by the combination of the third and the fourth sliding grooves 121a and 121b and the balls 123. A ball bearing combination between the first frame 102a and the second frame 102b can be easily understood through a ball bearing combination between the main frame 101 and the first frame 102a.

It is preferred that three or more first sliding grooves 111a, second sliding grooves 111b, third sliding grooves 121a, and fourth sliding grooves 121b are formed, respectively, thereby restricting the movements of the first and the second frames 102a and 102b to one plane.

The camera device 103 is installed on the second frame 102b. The camera device 103 includes both an image sensor 131 for receiving images of an object, and a sub-circuit board 135 for the installation and electrical connection of the image sensor 131. Further, a main circuit board 133c is mounted on the main frame 101, and the sub-circuit board 135 is connected to the main circuit board 133c through a predetermined circuit connection 133.

The camera device 103 is installed on the second frame 102b, so that the camera device 103 can move in the first and the second directions X and Y with respect to the main frame 101 together with the second frame 102b.

The main frame 101 is mounted on and fixed to a photographing apparatus such as a digital camera or a mobile communication terminal, and changes the position of the second frame 102b, i.e. the camera device 103, by an interaction between an electromagnetic force generated by applying an electric current to the coils 143 and a magnetic force, which is formed by the permanent magnets 125 for driving, according to the degree of hand trembling by a user when photographing is performed.

One of the coils 143 is installed in the first direction X together with one of the permanent magnets 125 facing said one of the coils 143, and the other one of the coils 143 is installed in the second direction Y together with one of the permanent magnets 125 facing the other one of the coils 143. The electromagnetic force generated by electric current applied to the coils 143 interacts with the magnetic force of the permanent magnets 125, thereby enabling the second frame 102b to move in the first direction X or the second direction Y In a state in which electric current is not applied to the coils 143, the attraction between the permanent magnets 125 and the yoke 147 of the coil member 104 causes the second frame 102b to return to the initial position established in the initial assemblage.

Further, the attraction between the permanent magnets 125 and the yoke 147 of the coil member 104 prevents the second frame 102b from moving in the third direction, i.e. the direction Z in which images of an object are incident. Accordingly, this prevents the camera device 103 from moving in the direction Z and deviating from a focal distance of a lens system mounted before the camera device 103.

When it is difficult to prevent the camera device 103 from moving in the third direction Z due to a weak attraction between the permanent magnets 125 and the yoke 147 of the coil member 104, this can be compensated for by installing a separate elastic member such as a spring. The elastic member is interposed between the main frame 101 and the driving frame 102, thereby preventing the second frame 102b from moving in the third direction Z.

Meanwhile, both the yoke 126 attached to the upper surface of the permanent magnets 125 and the yoke 147 of the coil member 104 forms a magnetic shield structure for inducing electric field so that the magnetic force of the permanent magnets 125 effectively operates and prevents the electric field from being leaked outside, thereby preventing the magnetic force of the permanent magnets 125 from affecting peripheral circuit devices, etc.

The position detection sensors 145 track the movement position of the second frame 102b. It is preferred that the position detection sensors 145 is spaced from the coils 143 by a predetermined distance in order to prevent the position detection sensors 145 from being affected by the electromagnetic force generated by the coils 143. The position detection sensors 145 may use an optical sensor, a hall sensor, etc. An optical sensor can perform a position detection of high accuracy, but it may increase manufacturing cost because it is expensive. A hall sensor has low detection sensitivity as compared with an optical sensor, but it has a low price and it can provide sensitivity suitable for correcting hand trembling. In the present embodiment, the position detection sensors 145 are formed by means of a pair of hall sensors, and the permanent magnets 127 for sensing are mounted on the second frame 102b, so that it is possible to detect change in the position of the second frame 102b.

Since most photographing apparatuses equipped with the optical image stabilizer 100 as described above use rechargeable batteries, a permanent magnet of a ND series, i.e., the permanent magnet 125 with a strong magnetic force, is used in order to save power consumed by the optical image stabilizer 100. In the case of using a permanent magnet with a strong magnetic force, the response speed or correction speed of the driving frame 102 may deteriorate due to an excessive attraction between the yoke 147 of the coil member 104 and the permanent magnets 125 on the second frame 102b. Accordingly, it is preferred to determine the strength of a permanent magnet in consideration of attraction due to a magnetic force, weight of a driving frame, a friction force in movement for correcting hand trembling, etc.

A yoke with permeability or a separate permanent magnet is arranged at one side of the main frame 101, so that it is possible to exactly maintain the initial stop position of the camera device 103 by means of attraction toward or repulsion from the permanent magnets 125 of the second frame 102b. Accordingly, it is possible to easily realize a position control algorithm of the second frame 102b and improve a correction speed.

The yoke 126, which is attached to the upper surfaces of the permanent magnets 125 and 127 and forms a magnetic circuit of a magnetic pole, decreases reluctance of magnetic flux generated by the permanent magnets 125 and 127 and simultaneously increases the strength of a magnetic force supplied to the coils 143. It is preferred that the yoke 126 is made from a metal material with high permeability. The yoke 126 may be separated or laminated according to the positions of the permanent magnets 125 and 127, and may be integrated with the permanent magnets 125 and 127.

The image sensor 131 corresponds to a photoelectric conversion device capable of receiving images of an object to be photographed, and digitally processing image information regarding colors, brightness, etc., which may use a Charge Coupled Device (CCD) sensor, a Complementary Metal Oxide Semiconductor (CMOS) sensor, etc. The image sensor 131 is mounted on an upper surface of the second frame 102b in an exposed state, compensates for the distortion of photographed images in the second direction Y by means of the movement of the second frame 102b, and compensates for the distortion of photographed images in the first direction X by means of the movement of the first frame 102a, thereby enabling images to be clearly photographed.

Hereinafter, the manufacturing process and construction of the circuit connection 133 will be described with reference to FIGS. 7 to 12. As described above, the circuit connection 133 electrically connects the sub-circuit board 135 to the main circuit board 133c, and provides a communication path between the image sensor 131 and the main circuit board 133c.

Figure 8:
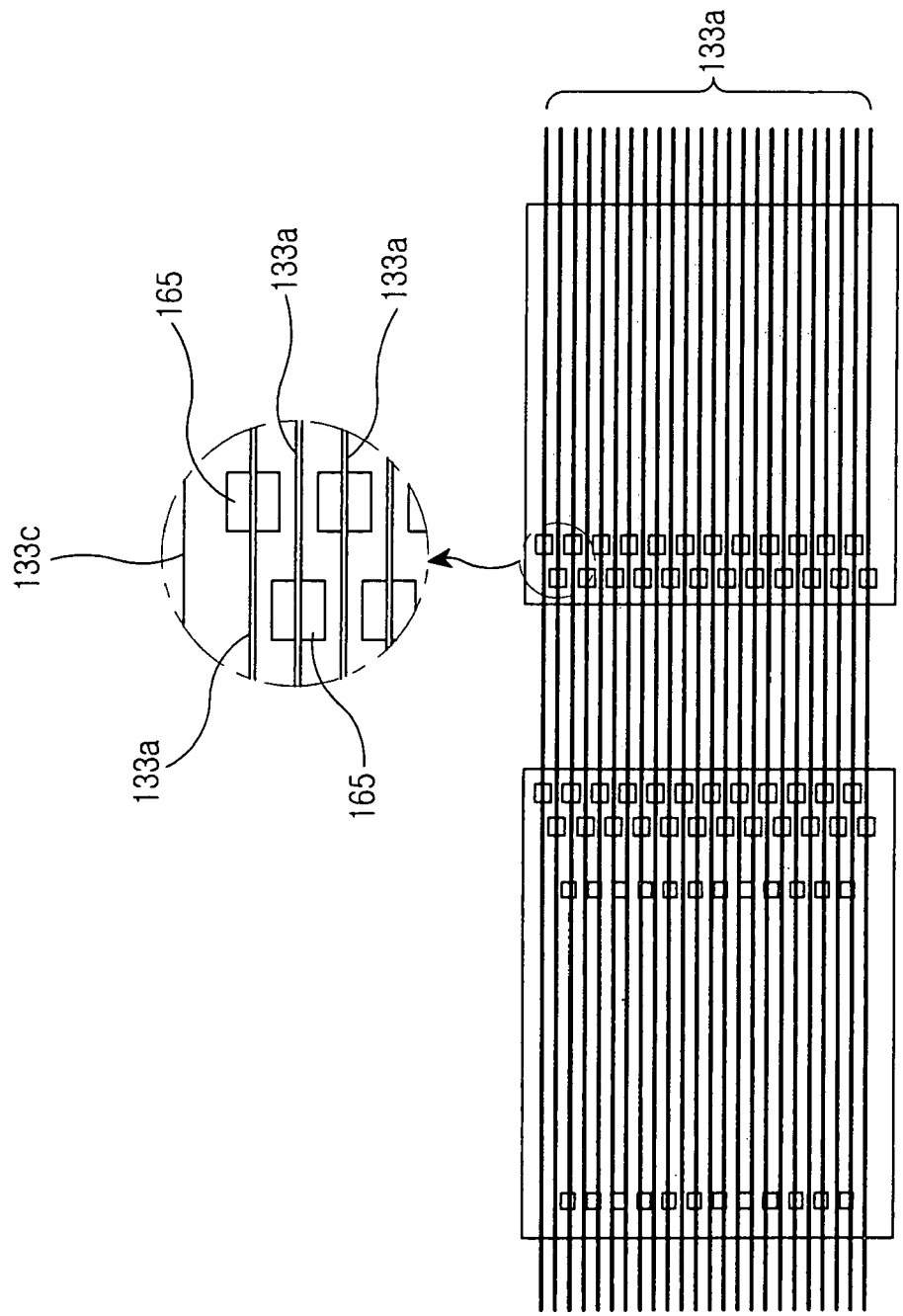
Figure 9:
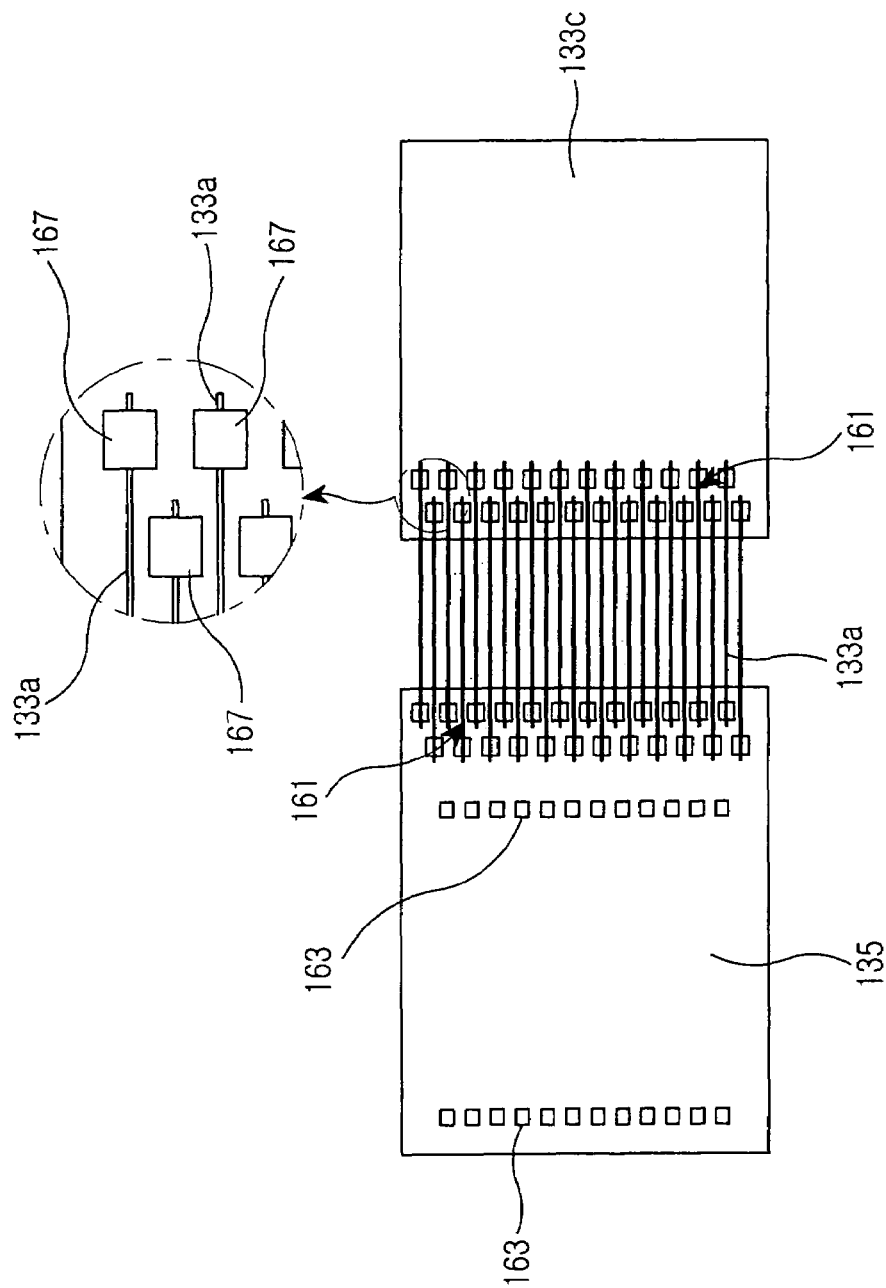

Connection portions 161 are formed at the edges of one end of both the main circuit board 133c and the sub-circuit board 135, respectively. Each connection portion 161 comprises an array of a plurality of soldering bases 165 as illustrated in FIG. 8. Further, the sub-circuit board 135 includes other soldering bases 163 for installation of the image sensor 131.

The main circuit board 133c and the sub-circuit board 135 are aligned so that the soldering bases 165 formed in the respective connections 161 are located on a straight line, a plurality of lead wires 133a are arranged above the soldering bases 165, the soldering bases 165 are connected in a one-to-one fashion by means of the lead wires 133a, then soldering 167 is performed for the soldering bases 165. A method for respectively bonding the lead wires 133a to the soldering bases 165 may also include an ultrasonic bonding method in addition to soldering. According to the ultrasonic bonding, the ends of the lead wires 133a are arranged on the soldering bases 165, then ultrasonic waves are applied to the ends of the lead wires 133a to fused-bond the ends of the lead wires 133a to the soldering bases 165.

Figure 10:
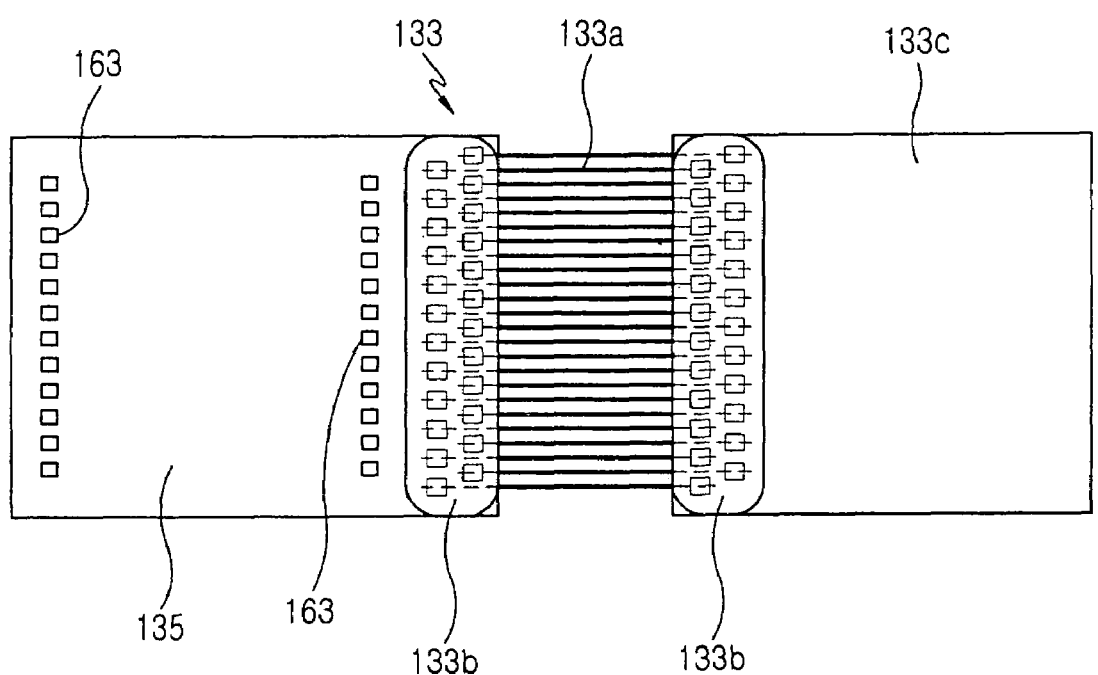
Figure 11:
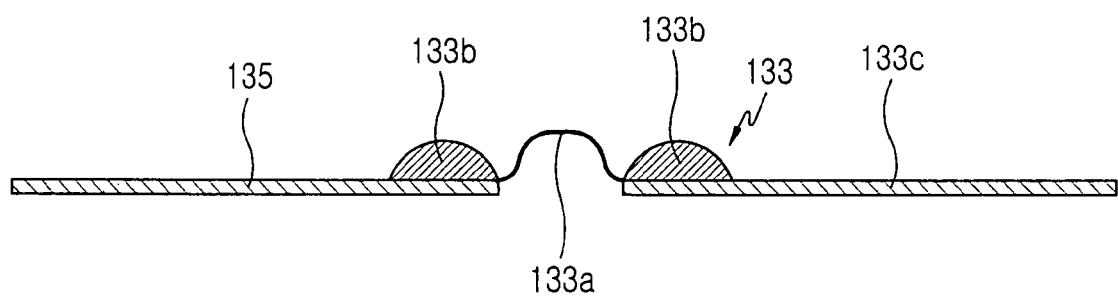
FIG. 11 is a side view illustrating a circuit connection of a main circuit board and a sub-circuit board in the camera lens assembly shown in FIG. 2.
Figure 12:
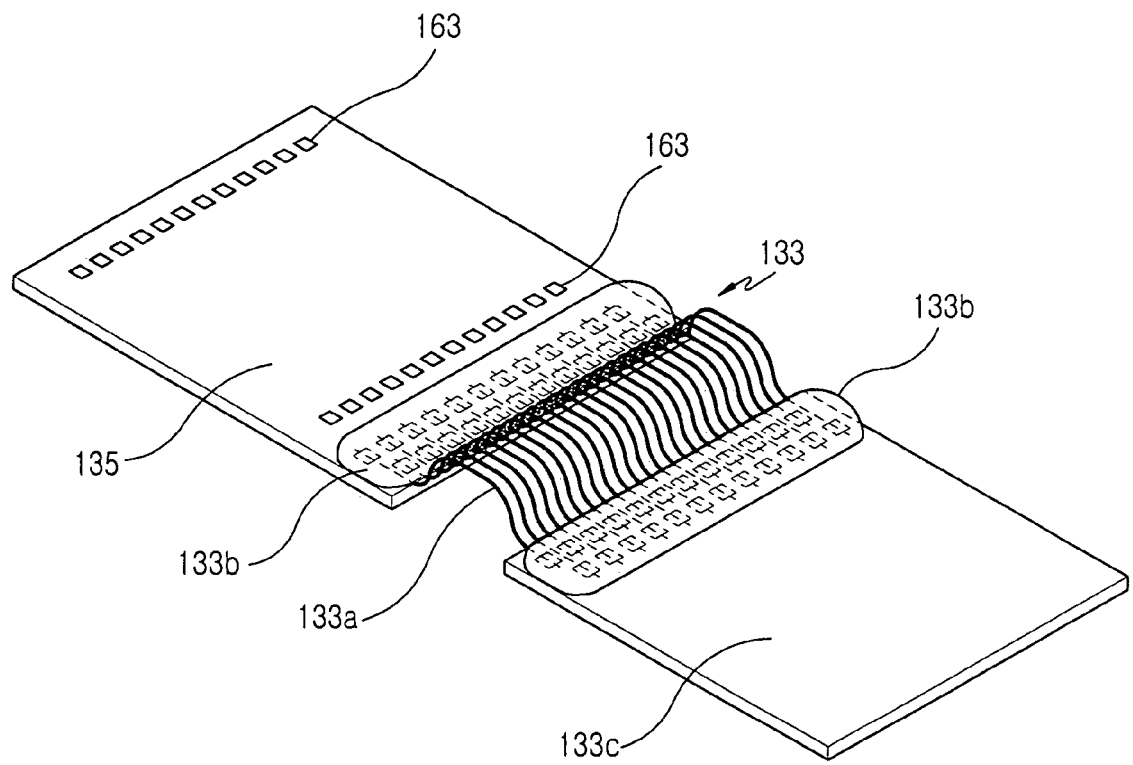
FIG. 12 is a perspective view illustrating a circuit connection of a main circuit board and a sub-circuit board in the camera lens assembly shown in FIG. 2.

After the soldering 167 is performed, unnecessary lead wires are removed, and reinforcement members 133b are coated on the connection parts 161 as illustrated in FIG. 10. The reinforcement member 133b is for preventing the soldering portions of the lead wires 133a from being disconnected or damaged even when the sub-circuit board 135 moves with respect to the main circuit board 133c. Herein, the reinforcement member 133b may utilize both hard epoxy and flexible epoxy. That is, after hard epoxy with high hardness is coated on the connection parts 161 of the lead wires 133a, flexible epoxy with low hardness may be coated on portions one more time, at which the surface of the hard epoxy borders the lead wires 133a, if the coated hard epoxy is completely hardened. In this way, even when the second frame 102b moves, it is possible to prevent stress from being concentrated on the portions at which the surface of the hard epoxy borders the lead wires 133a. The lead wires 133a are subjected to coating for insulation and are movably constructed individually.

The main circuit board 133c is mounted on the main frame 101, and the sub-circuit board 135 is mounted on the second frame 102b and moves with respect to the main frame 101. Even when the sub-circuit board 135 moves, it is preferred that the lead wires 133a have, at least in part, a curvature portion having a slow curved shape in order to prevent an external force such as a tensile force from being applied to the circuit connection 133, i.e. the lead wires 133a. As described above, the lead wires 133a may be moved separately and they have, at least in part, a curvature portion, so that it is possible to prevent the load of the circuit connection 133 from being applied to the sub-circuit board 135 even when the sub-circuit board 135 moves with respect to the main circuit board 133c. In this way, it is possible to easily control the movement of the second frame 102b and thus consumption power can be reduced.

In a conventional image stabilization operation moving in a vertical direction of a flexible printed circuit, the load of the flexible printed circuit have become more severe. However, since the lead wires 133a of the circuit connection 133 may be moved separately, it is possible to ensure an improved correction rate regardless of the movement direction of the camera device 103.

In constructing the circuit connection 133 as described above, when the lead wires 133a with a diameter of 0.005 mm to 0.08 mm are used, signals are stably transmitted between the main circuit board 133c and the image sensor 131, and the load is not applied to the movement of the sub-circuit board 135. When lead wires with a diameter less than 0.005 mm are used, the load applied to the sub-circuit board 135 is reduced, but either stabilization of signal transmission, or the efficiency of the arrangement of lead wires and in a soldering process may deteriorate. However, when lead wires with a diameter exceeding 0.08 mm are used, stabilization of signal transmission and the efficiency of a process for circuit connection are improved, but the correction rate may deteriorate due to the load applied to the sub-circuit board 135. The lead wires 133a with a diameter of 0.005 mm to 0.08 mm are used and the material of the lead wires 133a is properly selected, so that stabilization of signal transmission can be increasingly improved. For example, when a fine lead wire with the diameter as described above is made from gold, for example, it is possible to ensure a sufficient stabilization between the main circuit board 133c and the image sensor 131. A lead wire may be made from copper, silver and gold in addition to enameled wire. When a lead wire is made from silver, gold may be coated on the circumference of the silver.

In the optical image stabilizer 100 according to the embodiment of the present invention, the position of the camera device can be altered in the two directions X and Y to each other. Herein, a driving force for altering the position of the camera device 103 is generated by an interaction between both a coil, which receives electric current and generates an electromagnetic force, and a magnetic force of a permanent magnet. The camera device has a limited movement range within several tens to several hundreds of μs. As the camera device has a wider movement range, it is apparent to those skilled in the art that it is advantageous to correct the distortion of photographed images due to large amounts of hand trembling. However, it is usual that it is possible to correct the distortion of photographed images due to hand trembling by moving a camera device within the range of several tens to several hundreds of μs. Further, when considering that correcting the distortion of photographed images by moving a camera device is for enabling a camera lens assembly to be mounted on an ultra-miniaturized digital camera, a mobile communication terminal, etc, it is not preferred to widen the movement range of the camera device. Those skilled in the art can properly establish the movement range of the camera device according to products and the use of a corresponding product.

An optical image stabilizer according to the present invention as described above corrects the distortion of photographed images due to hand trembling of a user, etc., by moving a camera device to compensate the trembling. Accordingly, when constructing a circuit connection for connecting an image sensor, which moves on a camera lens assembly, to a main circuit board, it is possible to prevent a load from being applied to a circuit board equipped with the image sensor by using multiple lead wires which can be moved separately. Accordingly, a driving force required for movement of a camera device for image stabilization is reduced, so that consumption power can be saved. Further, a high load resulting from the construction of the circuit connection is prevented, so that it is possible to easily correct the distortion of photographed images due to hand trembling, etc., by controlling the position of a camera device. As a result, the correction rate can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims, including the full scope of equivalents thereof. For example, so long as the movement and level state of the second frame can be smoothly maintained, it is possible to variously change the number of combinations of ball bearings.

What is claimed is:

1. An optical image stabilizer for a camera lens assembly, comprising:
   a main frame including a main circuit board;
   a driving frame disposed on the main frame to move in at least one direction;
   a camera device including a sub-circuit board and mounted on the driving frame; and
   a circuit connection having a plurality of lead wires for electrically connecting the main circuit board to the sub-circuit board,
   wherein both ends of the circuit connection is coupled to the main circuit board and the sub-circuit board, respectively, and the plurality of lead wires is provided so as to be moved separately with respect to the main circuit board and the sub-circuit board.

2. The optical image stabilizer as claimed in claim 1, wherein each of the lead wires has a diameter of 0.005 mm to 0.08 mm.

3. The optical image stabilizer as claimed in claim 1, wherein ends of the lead wires are respectively coupled to the main circuit board and the sub-circuit board, and wherein reinforcement members are coated on portions at which the ends of the lead wires are coupled to the main circuit board and the sub-circuit board, so that the lead wires are prevented from being disconnected at the coated portions.

4. The optical image stabilizer as claimed in claim 3, wherein the reinforcement member includes hard epoxy, which is coated on the portions at which the ends of the lead wires are coupled to the main circuit board and the sub-circuit board, and flexible epoxy coated on portions at which a surface of the hard epoxy borders the lead wires.

5. The optical image stabilizer as claimed in claim 1, wherein the circuit connection at least partially includes a curvature portion having a curved shape between the main circuit board and the sub-circuit board.

6. The optical image stabilizer as claimed in claim 1, wherein each of the lead wires is insulated.

7. The optical image stabilizer as claimed in claim 1, wherein each of the lead wires is made from one of gold, copper, silver and enameled wire.

8. The optical image stabilizer as claimed in claim 1, wherein each of lead wires is made from silver, and gold is coated on a circumference of the silver.

9. The optical image stabilizer as claimed in claim 1, wherein ends of the lead wires are joined to the main circuit board and the sub-circuit board by soldering or ultrasonic bonding.

10. The optical image stabilizer as claimed in claim 1, further comprising a pair of permanent magnets installed at the main frame or the driving frame, and a pair of coils installed at the driving frame or the main frame, wherein the driving frame moves by an interaction between an electromagnetic force generated by applying an electric current to the coils and a magnetic force of the permanent magnets.

11. The optical image stabilizer as claimed in claim 10, further comprising a yoke installed at the driving frame or the main frame together with the coils, wherein movement of the driving frame is restricted by an attraction between the yoke and the permanent magnets for driving in a direction in which images of an object are incident into the camera device.

12. The optical image stabilizer as claimed in claim 10, further comprising a yoke for surrounding the coils and the permanent magnets for driving, wherein the yoke forms a magnetic shield structure, thereby preventing an interference due to external magnetic field and radio interference.

13. The optical image stabilizer as claimed in claim 1, further comprising at least one ball bearing interposed between the main frame and the driving frame.

14. The optical image stabilizer as claimed in claim 1, further comprising at least one permanent magnet installed at the main frame or the driving frame and at least one position detection sensor installed at the driving frame or the main frame, wherein the position detection sensor detects movement of the driving frame according to change in lines of a magnetic force generated by the permanent magnets for sensing.

15. The optical image stabilizer as claimed in claim 1, wherein the driving frame comprises:
   a first frame installed so as to be moved with respect to the main frame in a first direction on the main frame; and
   a second frame installed on the first frame, the second frame moving in the first direction together with the first frame and being installed so as to be moved with respect to the main frame in a second direction.

16. The optical image stabilizer as claimed in claim 15, further comprising:
   at least one first sliding groove formed along the first direction or the second direction on the main frame and facing the first frame;
   a second sliding groove formed along the first direction or the second direction on the first frame and facing the first sliding groove; and
   a ball installed so as to be partially accommodated in the first sliding groove and the second sliding groove, respectively, thereby spacing the main frame from the first frame,
   wherein the first frame moves on the main frame in a direction in which the first sliding groove and the second sliding groove extend.

17. The optical image stabilizer as claimed in claim 15, further comprising at least one ball bearing interposed between the first frame and the second frame.

18. The optical image stabilizer as claimed in claim 17, wherein the ball bearing comprises:
   at least one third sliding groove formed along the second direction or the first direction on the first frame and facing the second frame;
   a fourth sliding groove formed along the second direction or the first direction on the second frame and facing the third sliding groove; and
   a ball installed so as to be partially accommodated in the third sliding groove and the fourth sliding groove, thereby spacing the first frame from the second frame,
   wherein the second frame moves on the first frame in a direction in which the third sliding groove and the fourth sliding groove extend.

19. The optical image stabilizer as claimed in claim 15, further comprising at least one permanent magnet for sensing, which are installed at the main frame or the second frame, and at least one position detection sensor, which are installed the second frame or the main frame,
   wherein the position detection sensor detects movement of the second frame according to change in lines of a magnetic force generated by the permanent magnets for sensing.

20. The optical image stabilizer as claimed in claim 15, wherein the permanent magnets are installed at the main frame or the second frame of the driving frame, and the coils are installed at the second frame of the driving frame or the main frame.

* * * * *